United States Patent
Chalupka et al.

(10) Patent No.: US 6,661,015 B2
(45) Date of Patent: Dec. 9, 2003

(54) PATTERN LOCK SYSTEM

(75) Inventors: Alfred Chalupka, Vienna (AT); Gerhard Stengl, Wernberg (AT); Hans Loschner, Vienna (AT); Robert Nowak, Vienna (AT); Stefan Eder, Vienna (AT)

(73) Assignee: IMS-Ionen Mikrofabrikations Systeme GmbH, Vienna (AT)

( * ) Notice: Subject to any disclaimer, the term of this patent is extended or adjusted under 35 U.S.C. 154(b) by 85 days.

(21) Appl. No.: 09/950,140

(22) Filed: Sep. 10, 2001

(65) Prior Publication Data
US 2002/0033457 A1 Mar. 21, 2002

(30) Foreign Application Priority Data
Sep. 15, 2000 (AT) ................ A 1576

(51) Int. Cl.[7] .............. G01J 1/00; G01N 21/00; G01N 23/00
(52) U.S. Cl. .................... 250/491.1
(58) Field of Search ............... 250/491.1

(56) References Cited

U.S. PATENT DOCUMENTS

| 4,823,011 A | * 4/1989 | Stengl et al. | 250/491.1 |
| 4,967,088 A | * 10/1990 | Stengl et al. | 250/491.1 |
| 5,365,072 A | * 11/1994 | Turner et al. | 250/491.1 |
| 5,742,062 A | * 4/1998 | Stengl et al. | 250/396.8 |

* cited by examiner

Primary Examiner—Benjamin R. Fuller
Assistant Examiner—Alfred E Dudding
(74) Attorney, Agent, or Firm—Thomas R. Vigil; Welsh & Katz, Ltd.

(57) ABSTRACT

In a particle projection lithography system, an alignment system is used to determine alignment parameters to measure the position and shape of an optical image of a pattern of structures formed in a mask and imaged onto a target by means of a broad particle beam, by means of an apparatus with a plurality of alignment marks adapted to produce secondary radiation upon irradiation with radiation of said particle beam. In order to allow for a variation of the alignment parameters along the optical axis, the alignment marks are positioned outside the aperture of the alignment system for the part of the beam that generates said optical image, arranged at positions to coincide with particle reference beams projected through reference beam forming structures provided on the mask while said optical image is projected onto the target, and situated on at least two different levels over the target as seen along the directions of the respective reference beams.

11 Claims, 4 Drawing Sheets

PATTERN LOCK SYSTEM

FIELD OF THE INVENTION AND DESCRIPTION OF PRIOR ART

The present invention relates to image alignment in particle projection lithography. In particular, the invention relates to an apparatus in a particle projection lithography system for use in an alignment system adapted to measure the position and shape of an optical image of a pattern of structures formed in a mask and imaged onto a target by means of a broad particle beam, wherein the apparatus has a plurality of alignment marks adapted to produce secondary radiation upon irradiation with radiation of said particle beam and is provided with an aperture through which passes the part of the beam that produces the optical image.

Methods and devices for the alignment of the imaged structure pattern on a target, such as a wafer substrate, in a particle projection system are well-known and are discussed in detail in the U.S. Pat. Nos. 4,967,088 and 4,823,011. The entire contents of these two U.S. patent documents are hereby incorporated by reference.

Of the various processes required to manufacture semiconductor devices, lithography is highly important. Simply described, the lithography process begins by coating a substrate, e.g. a silicon wafer with a thin layer of a material, called photo-resist or simply "resist", which is sensitive to radiation such as ion radiation. A lithographic exposure tool projects an image of a pattern contained on a mask or reticle onto the resist-coated wafer. The wafer may be stepped through a series of exposure positions by which the same pattern of the mask is exposed a number of times on the wafer, each exposure position corresponding to one of a number of chips into which the wafer will be parted after all processing. Development leaves a resist pattern that delineates the desired images on the wafer surface. The wafer is then subjected to any one of many possible processes such as etching, oxidation, ion implantation, diffusion, and deposition.

In the process of forming a pattern on a wafer to conform to a desired circuit design, it is often necessary to image several complementary mask patterns at a single chip position. To accurately produce the features of a given circuit, the various mask patterns must be carefully overlayed, and referencing of the image with the wafer position is necessary. The demands on quality of such overlay are becoming increasingly stringent from year to year as circuit features continue to become smaller, in accordance with the trend in the microelectronic field.

The alignment system disclosed in the U.S. Pat. Nos. 4,967,088 and 4,823,011 provides real time measurement and adjustment of the position and size of the image field before and during the time of exposure. The alignment is done, e.g., with respect to the X and Y translation of the image in the wafer plane, rotation angle θ and magnification $M_X$ and $M_Y$ with respect to the lateral scales, respectively, as well as trapezoid distortion $\Delta_X$ and $\Delta_Y$. During exposure, variations of these parameters may occur by voltage fluctuations (magnification M) or by slight movements of the target station with respect to the projection system, both in lateral directions X,Y and in Z-direction, the latter causing also change in magnification M. All these parameters can be measured from a set of alignment marks provided on, e.g., a reference plate which is positioned in front of the target as seen in the direction of the irradiating beam. The optical image is projected through an aperture provided in the reference plate, while the alignment marks are positioned on the reference plate around the aperture and are irradiated by respective reference beams which are formed in the mask and imaged onto the plane of the reference plate together with the pattern beam used for the optical image of the structure pattern to be formed on the target.

In particular when ions are used as irradiating particles, the depth of focus can be very high, so that the reference beams which are focused on the target plane are still in focus sufficiently in the plane of the reference plate even if the reference plane is set off from the target by some distance, as long as this distance is less than the depth of focus, allowing to provide tools such as a beam shutter between the target and the alignment system. Moreover, a spatial separation of the substrate and the alignment system can be useful to avoid contamination of the alignment detectors by material scattered off from the substrate. If, however, the distance of the reference plane from the target is not negligible, the size and shape of the image on the target depend also on the angle at which different parts of the beam traverse the reference plane. If voltage fluctuations or Z shift of the target occur, it is therefore not sufficient to correct merely for the magnification, which is what known alignment systems do. Known alignment systems do not measure the angle at which the reference beam impinges on the reference plate and therefore do not allow for an alignment of the angle at which the beam is impinging onto the target plane. The consequence is a possible misalignment between the corrected image and desired shape in case of voltage fluctuations or target shift or tilt.

SUMMARY OF THE INVENTION

In is an aim of the present invention to offer a way for pattern alignment which allows the measurement and adjustment of beam properties that are dependent on the z-coordinate, that is, the position along the optical axis. In particular, the invention aims at the measurement and adjustment of the direction in which the beam traverses the alignment system.

This aim is met by an apparatus as mentioned in the beginning wherein, according to the invention, the apparatus has a plurality of alignment marks which are
- positioned outside the aperture for the beam part generating the optical image of the structure pattern,
- arranged at positions to coincide with particle reference beams projected through reference beam forming structures provided on the mask while said optical image is projected onto the target, and
- situated on at least two different levels over the target as seen along the directions of the respective reference beams.

The provision of alignment marks at different Z levels allows for an alignment which takes into account a possible non-vanishing beam landing angle or other beam landing parameters. By virtue of the invention, alignment parameters, such as the lateral scale or magnification, can be determined for each level and adjusted to, e.g., preset nominal values.

By virtue of the comparatively large distance of levels the invention enables detection of even small differences in the alignment parameters occurring when varying the Z position along the optical axis. Thus, the invention offers the possibility to space apart the alignment plane from the target plane without loss of control of the image position and shape, and thus helps to relax the requirements posed on the optical system with respect to homocentricity or telecentricity of the beam projected onto the target.

In this context, it is suitable if the system has a high depth of focus (DOF) so that the region of focusing of the beam covers the target and alignment planes even when they are spaced apart considerably. For this, an ion projection lithography system wherein the particles are ions is particularly useful.

Preferably, in order to reliably maintain preset locations of the alignment marks according to the requirements of the projection system, the alignment marks are situated on positioning means disposed outside the aperture for the image generating beam part and are positioned on sides of the positioning means directed towards the mask. Preferably, the alignment marks may be formed on the surface of platelets, the platelets being fixed onto the positioning means by bonding. Moreover, the platelets may be silicon platelets in which the alignment marks are formed as structures of different height with respect to the surrounding surface of the silicon platelet, e.g. as grooves.

A preferred embodiment comprises a reference plate adapted to be positioned in a predetermined position relative to the target, being provided with an aperture corresponding in size to the part of the beam that generates said optical image, and with alignment marks disposed outside said aperture. Suitably, the reference plate may be a zerodur plate.

In order to obtain a compact arrangement of the alignment setup, the apparatus according to the invention is further provided with detector means for each alignment mark provided with an electrode adapted to measure a secondary electron current emitted from the alignment marks. In this case, the electrode may be formed asymmetric with respect to the corresponding alignment mark and held at a positive electrical potential with respect to the potential of the alignment mark and surrounding components, in order to achieve a high yield of the secondary electrons.

Preferably, eight alignment marks are positioned on a first level and four alignment marks are positioned on a second level.

The use of particle radiation, in particular ion radiation, allows a considerable distance between the individual alignment planes, up to several millimeters, e.g. 5 mm. In order to increase the reliability of the alignment parameters obtained according to the invention with respect to the projection onto the target plane, the distance between two different levels may suitably be chosen in the order of the distance of the alignment marks from the plane defined by the target surface.

BRIEF DESCRIPTION OF THE DRAWINGS

In the following, the present invention is described in more detail with reference to the drawings showing.

DETAILED DESCRIPTION OF THE INVENTION

For the explanations following below, a Cartesian coordinate system will be used with Z denoting the direction given by the optical axis and X, Y denoting the other 2 dimensions, i.e., in a plane perpendicular to the Z-axis.

Figure 1:
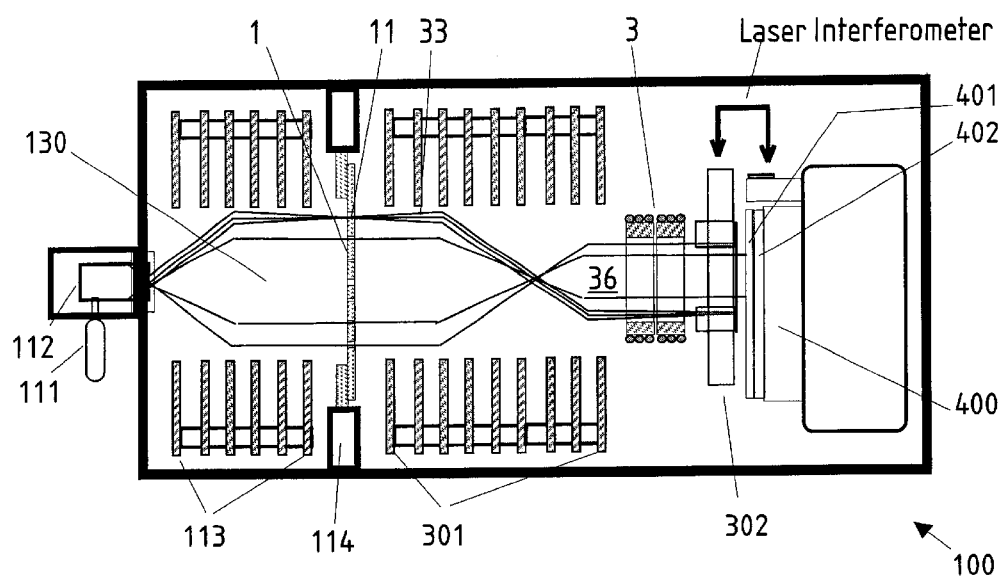
FIG. 1 an ion-beam lithography apparatus which is suitable for realization of the invention, in a longitudinal sectional view along the optical axis of the system.

Referring to the longitudinal sectional view of FIG. 1, a preferred embodiment of an ion projection lithography machine 100 is shown. The main components are, in sequence, the ion source 112, the illumination system 113, the mask assembly 114 including a stencil mask 1, the optical column 301, the pattern lock system 302 including a scanner block and a reference plate, and the target stage 400. Ions, in this preferred embodiment $H_2^+$ or $He^+$ ions, taken from a supply 111 are produced from the ion source 112, and pass through the illumination system which projects a broad ion beam 130 onto the mask, the beam 130 being substantially parallel to the optical axis.

The beam passes through the mask 1 and enters the ion optical column 301. The beam is accelerated by the first electrodes of the ion optical column 301 so that it converges and forms a crossover or an image of the ion source before it is decelerated and made substantially parallel to the optical axis and forms an image of the mask structures on the substrate 401 attached to the target stage 400 by the wafer chuck 402. Behind the crossover of the ion beam, within the ion optical column 301, there is a pattern lock optics assembly 3, preferably consisting of two successive multipoles which, by application of suitable dipole fields alter the beam position in the X, Y plane. By applying to the two multipoles dipole fields equal in magnitude but opposite in sign, the beam may be offset from its original path while remaining parallel to it. The magnitude of these deflections are controlled by the pattern lock device 302 in response to signals generated from the alignment beams and may be, for example, as high as ±5 μm. The multipoles may be used to generate any even-powered fields (e.g. dipole, quadrupole, octupole etc.). In the practice of the preferred embodiment, the higher-order fields are preset to correct for system distortions while the dipole fields for the deflection are superimposed. The pattern lock optics 3 also include one or more solenoids which are steered by the pattern lock device 302. Any electrical current through the solenoids generates a magnetic field which exerts a Lorentz force on the ions in such a way that the beam and thus the ion optical image is rotated around the optical axis.

The wafer 401 is mounted on a stage 400 which allows precision motion with respect to the X, Y and Z directions so that the wafer can be stepped from one position to another, and replicas of the image pattern can be formed at different positions on the wafer. Furthermore, the position of the wafer along the optical axis can be adjusted.

Just before the beam strikes the wafer, there is located a pattern lock arrangement 302, comprising an alignment beam deflector and detector system, which is used to monitor the position of the image formed on the wafer and produce signals to induce correcting action of the optical elements to the extent a misalignment is detected.

Figure 2:
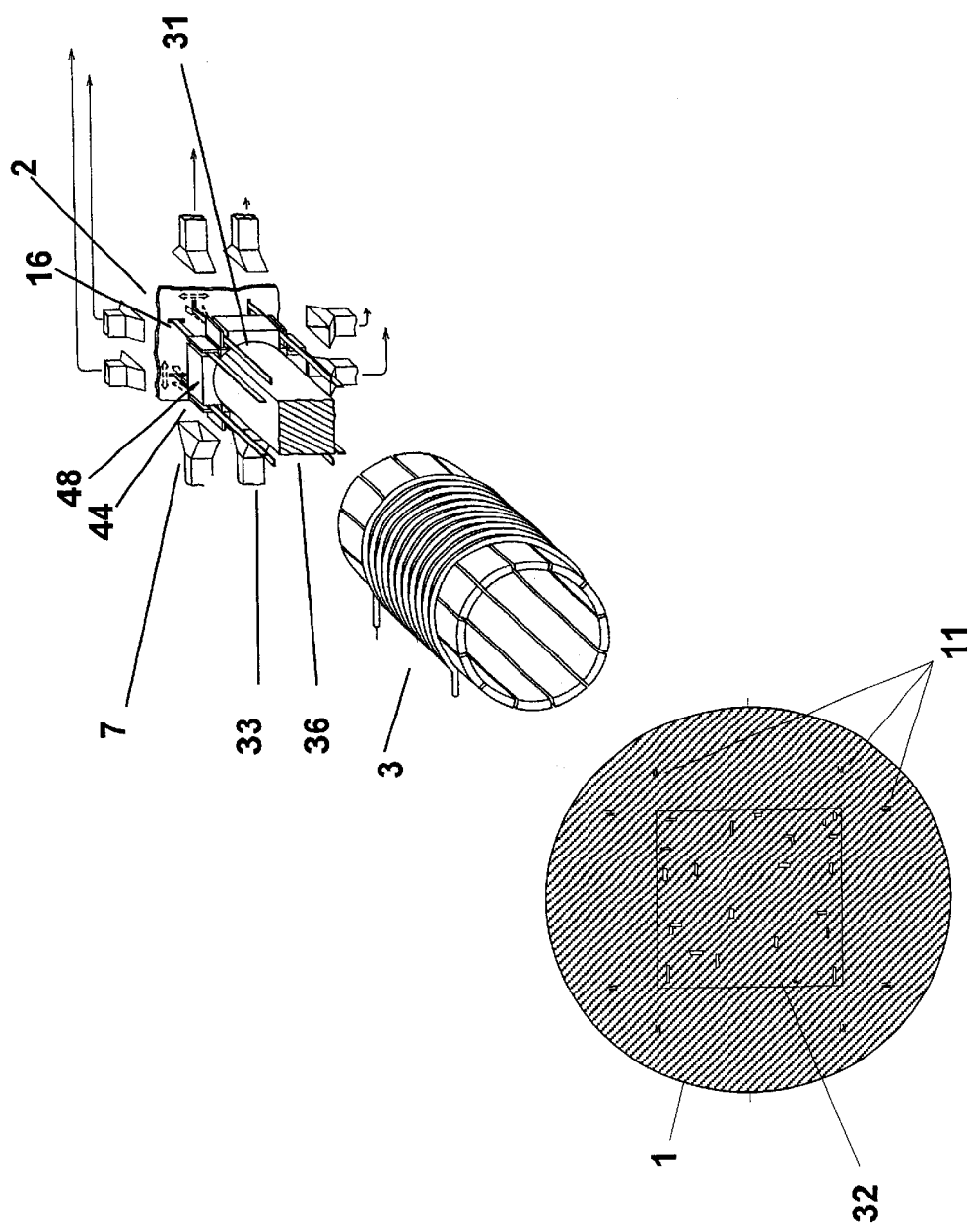
FIG. 2 the principles of an alignment system.

FIG. 2 shows the elements of a pattern lock system of the state of the art. For further details the reader is also referred to the U.S. Pat. No. 4,967,088. The mask 1 is disposed in the optical path of the broad beam coming from the ion source 112 (FIG. 1). The mask 1 is provided with a structure on a mask pattern field 32 which is to be imaged on the substrate 401 (FIG. 1) by the ion projection system. The image of the mask structure 32 is to be formed on the substrate in such a manner that a predetermined shape and relative position of the image of the mask structure 32 and of, for instance, an image which has previously existed on the substrate is obtained and remains constant during exposure. The mask 1 is provided with alignment apertures 11 serving as reference beam forming structures producing alignment beams 33, and images of the apertures 11 are formed on a reference plate 2 which is provided with alignment marks 16. The alignment marks 16 are, for instance, realized as grooves formed in the otherwise planar surface of the reference plate 2. The images of the apertures 11 of the mask 1 on the reference plate 2 are adjusted to coincide with the respective corresponding marks 16.

A pattern lock optical means 3, comprising one or two electrostatic multipoles, for instance octopoles, and means for establishing an axial magnetic field, for instance one or two solenoids, are disposed in the optical path between the mask 1 and the reference plate 2. In the embodiment shown, the reference plate 2 is parallel to the wafer. The reference plate 2 has an aperture 31 which substantially corresponds in size to the image of the structure in the mask pattern field 32 which is to be formed on the wafer. The marks 16 on the reference plate 2 are disposed outside the optical path for the pattern beam 36 that forms the image on the wafer.

Detectors, shown in FIG. 2 symbolically as funnel detectors 7, are provided near the reference plate 2, to detect the secondary electrons which are emitted from the reference plate. The arrangement and function of the detectors will be explained more in detail hereinafter. The secondary electrons are due to the alignment beams 33 hitting the reference plate 2. By the deflections plates 44, the alignment beams 33 are swept across the alignment marks 16 on the reference plate 2. The amount of secondary radiation detected by the detectors 7 changes drastically when the alignment beam 33 starts striking the alignment marks 16; thus, the signals from the detectors 7, adapted to be delivered to a control device (not shown), are used for control of the pattern lock optics 3. The pattern lock optics 3 serves as an ion-optical correcting element in order to adjust the ion beam according to the alignment requirements. By the control of the ion beam, the image of the marks 11 on the mask 1 is caused to coincide with the respective corresponding marks 16 on the reference plate 2. During a sweep of the image of the marks 11 on the mask 1 across the alignment marks 16 on the reference plate 2, from the signals of the detectors 7, the average position of the alignment beam 33 relative to the alignment marks 16 on the reference plate 2 will be derived, and corresponding correction signals will be delivered to the pattern lock optics 3 and the voltage supplies of the electrodes as described in detail in the U.S. Pat. No. 4,967,088.

The detectors may consist of commercially available electron multiplier channels, which generate an output voltage corresponding to the rate of incoming electrons, by means of the succeeding electronic circuitry as described in the U.S. Pat. No. 4,967,088. Preferably, in order to achieve a compact detector setup, the detectors are realized as secondary electron current detectors working in a continuous current measurement mode as described in detail below.

Figure 3:
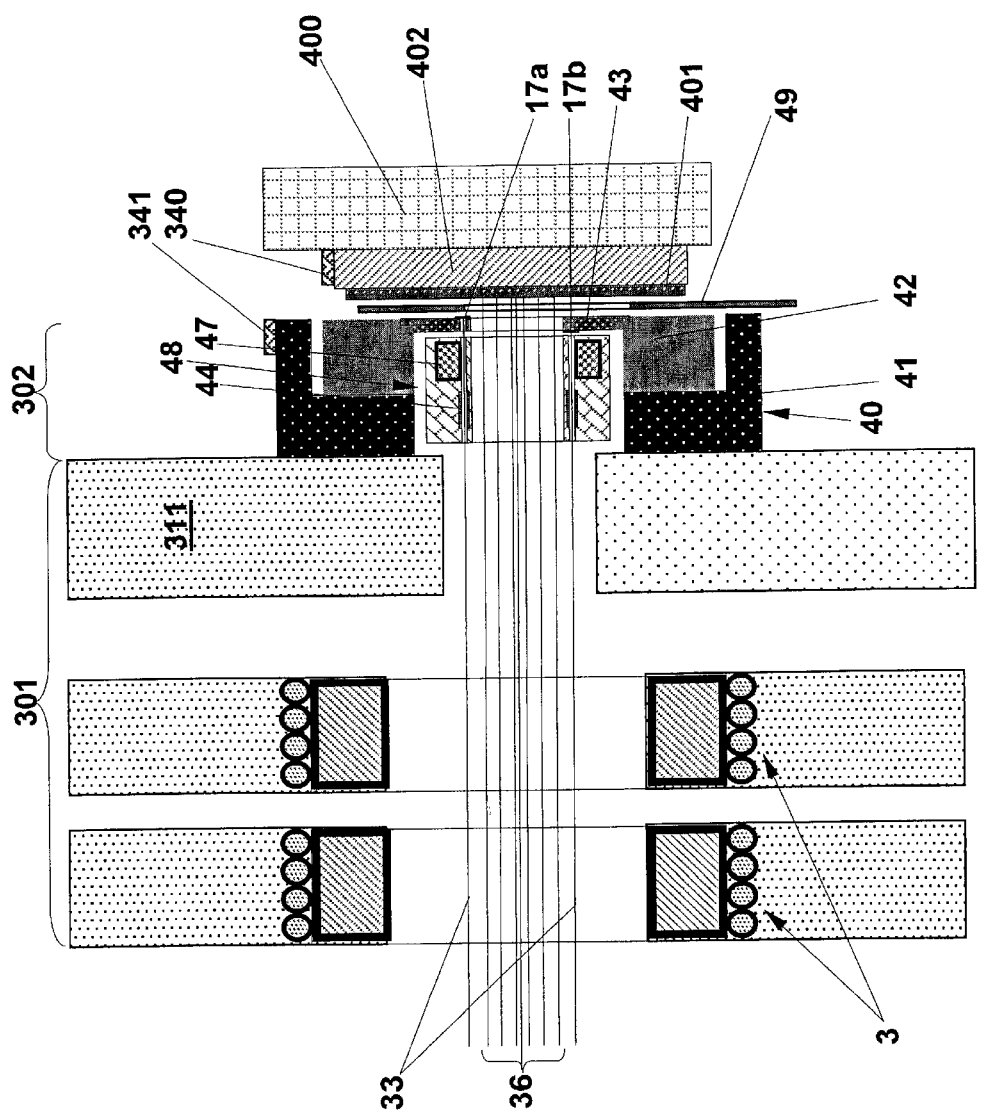
FIG. 3 the alignment system according to the invention in a longitudinal section.

FIG. 3 shows one possible arrangement of the pattern lock device 302 according to the invention. The pattern lock device consists of the reference frame arrangement 40 and a scanner block 48. In the variant shown in FIG. 3, the reference frame arrangement 40 is mounted to the last electrode 311 of the electrostatic ion-optical column 301, and the scanner block 48, comprising the detectors 47 and deflection plates 44 for the reference beams 33, is fixed on the main plate 41 of the frame arrangement 40.

The pattern beam 36 is projected through the optical column 301 onto the target, for instance a silicon wafer 401, mounted on a target stage 400 by means of a wafer chuck 402. The relative position of the target stage 400 and the pattern lock device 302 is measured interferometrically, by means of mirrors 340,341 mounted on the wafer chuck 402 and the pattern lock frame 40, respectively. A mechanical shutter 49 is positionable between the reference plate 43 and the target stage 400 with the target 401 to shut off the target from exposure to the ion beam 36 between exposure intervals.

As discussed further in detail in the U.S. Pat. No. 4,967,088, the deflection plates 44 are used to scan the reference beams 33 (hereafter also sometimes called "beamlets") across the alignment marks 17a,17b provided on the reference plate 43. Electrons produced as secondary radiation from the beamlet impinging upon the marks are detected by the detectors 47. It should be understood that detectors are provided for all alignment marks. The signals from the detectors are used to determine the position and orientation in X, Y, the position in Z and the shape of the image projected by the pattern beam 36 on the wafer 401. In response to the signals, correcting fields may be applied by the optical elements 3 as well as to one or more of the lens electrodes 113.

Figure 4:
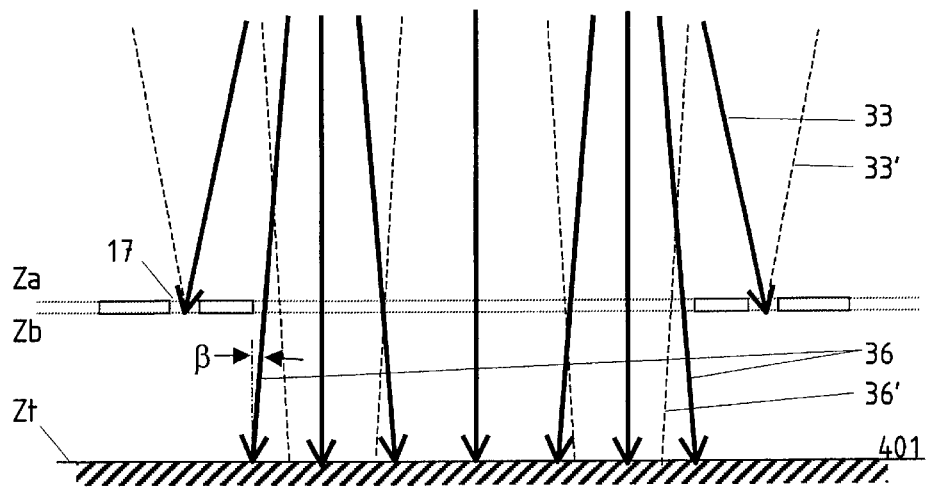
FIG. 4 the dependence of the beam landing angle upon the radial distance from the optical axis.

In the optical system of the lithographic tool, such as that of FIG. 1, the beam 36 strikes the target plane at a certain angle with the optical axis, the so-called "beam landing angle". In the embodiment shown, the direction of incidence of the beam 36 is nominally perpendicular to the target plane, i.e., the beam landing angle is substantially 0 degrees; in other embodiments it can also be chosen otherwise, depending on the design of the optical system, i.e. the beam may be substantially convergent or divergent at the target. Due to residual imaging defects of the optical system, there is a small deviation $\beta$ from the ideal angle, which in a typical case of an ion projection system is in the order of several mrad (milliradians). FIG. 4 shows diagrammatically a typical case of how the beam landing angle $\beta$ may depend on the distance from the optical axis: being zero at the optical axis, it may then assume e.g negative values (i.e., converging) up to a maximum (absolute) value, e.g. of several mrad at a certain distance from the optical axis, then increase again, e.g. going through zero and become positive (i.e., diverging) at outer radii.

It is clear that a beam landing angle deviating from the nominal angle can lead to a systematic misalignment, namely, a misalignment of the image on the target due to the distance of the reference plate, which represents the plane of alignment measurement, from the target plane. This is shown in FIG. 4 for the example of an ion beam configuration 33', 36' deviating from the nominal configuration 33, 36 corresponding to "ideal" optical parameters which produce a pattern image at the desired position on the target 401. True to the principle of alignment, the reference beam 33' is locked at its position with respect to the corresponding alignment mark even with the non-ideal optical parameters; thus, the pattern beam 36' would produce a shifted or distorted image. This misalignment is not due to a misalignment of the reference beams 33 within an alignment plane, rather, it is caused by a deviation of the landing angle $\beta$ from its nominal value. According to the invention, the provision of different alignment planes enables the determination of Z-dependent alignment parameters, such as the angle $\beta$ in order to rule out misalignment effects like the one illustrated in FIG. 4. In FIG. 4, also indicated are the target plane Zt as well as two alignment planes Za, Zb in which alignment marks 17 are positioned according to the invention.

The direction β of the ion beam 36, including the reference beams 33, can be described in general by a function of the position X,Y by an equation like the following:

$$\beta = a_1 X + a_2 Y + a_{11} X^2 + a_{12} XY + a_{22} Y^2 + \ldots$$

The invention allows determination of at least the first order coefficients $a_1$ and $a_2$ which can then be kept constant by proper adjustment of, e.g., the electrostatic potentials of the electrodes of the optical column 301 as well as the pattern lock optical means 3.

The distance of the reference plate from the target is limited to a maximum value corresponding to the depth of focus. On the other hand, with ion-beam systems, the numerical aperture can be held very small, in the order of $10^{-5}$, which makes the depth of focus (DOF) very high; in one embodiment according to FIG. 1, e.g., for Helium ions the DOF is about 5 mm. Therefore, it is possible to set off the reference plate 43 from the target 401 to a distance of several mm, which allows to provide, for instance, a shutter 49 just before the target. However, with this offset, there is the danger of misalignment due to beam landing angle deviation.

In the embodiment shown in FIG. 3, the reference frame arrangement 40 consists of a main plate 41, an intermediate plate 42, and a reference plate 43. The plates 41, 42 as well as the body of the reference plate 43 are produced separately from zerodur blanks and then assembled. Further referring to FIG. 5, according to the invention the reference plate 43 bears alignment marks 17a, 17b which are placed on different z-planes, i.e. at different levels over the target plane as measured along the optical axis. The alignment marks are formed as grooves on silicon platelets which are locally bonded to the zerodur plate forming the reference plate 43. In order to avoid radiation damage of the silicon platelets, a protective layer may be applied on the upper surface. In one embodiment, for He+ ions impinging with an energy 75 keV on the reference marks, the silicon platelets are coated by 500 nm platinum.

Figure 5:
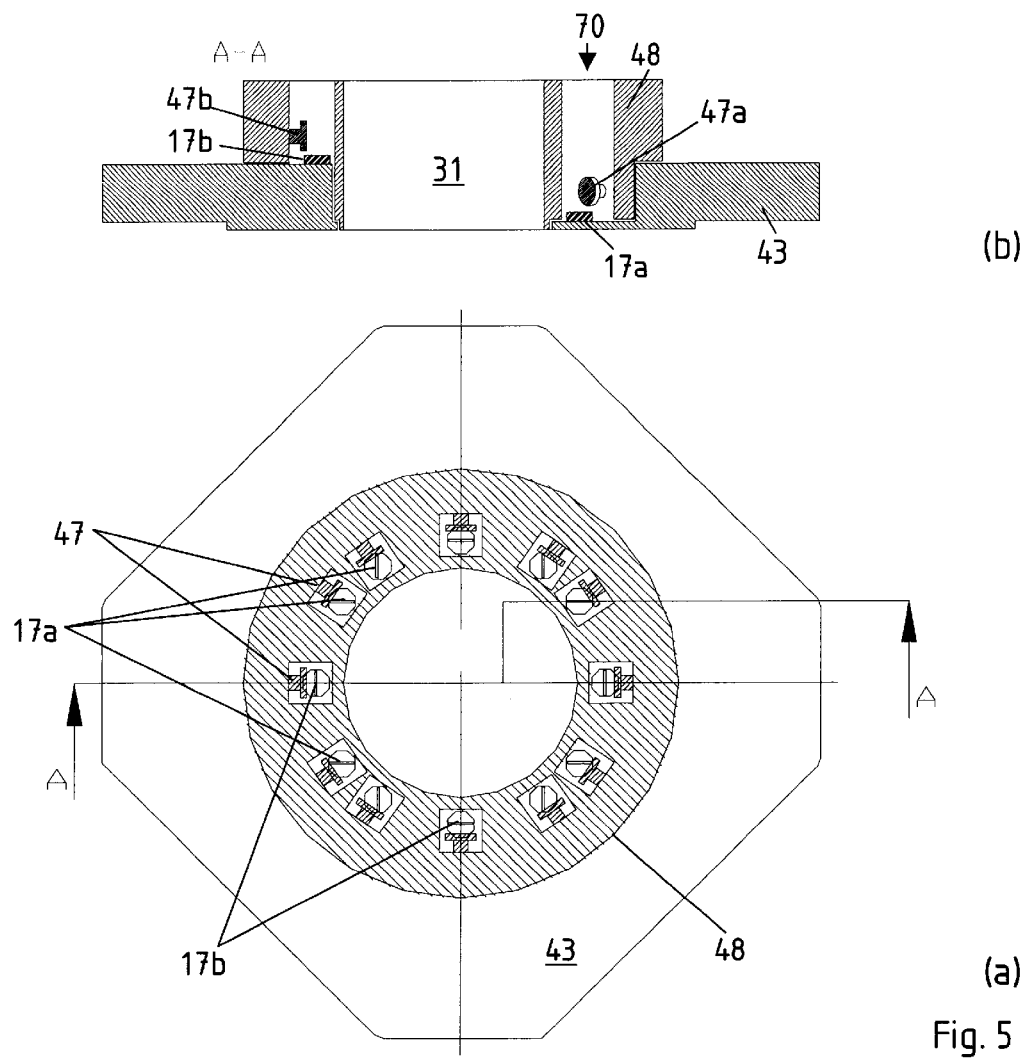
FIGS. 5a, 5b in a top view (FIG. 5a) and a longitudinal section (FIG. 5b), a detail of the reference plate of FIG. 3, also showing the arrangement of detectors.

As can be seen from FIG. 5, eight platelets each bearing an alignment mark 17a, are located at a first level while four platelets with marks 17b are located on a second level on the plate which is less near to the mask. FIG. 5, in particular FIG. 5b which represents a longitudinal section along the line A—A defined in FIG. 5a, schematically shows also the end portion of the reference beam channels 70 of the scanner block 48, in which the detectors 47a, 47b may be located.

As can further be seen from FIG. 5, the eight marks 17a are oriented in a double-cross like manner. As already discussed in the U.S. Pat. No. 4,967,088 in detail, these eight marks allow determination of the parameters relating to position and scales of the pattern image on the target, e.g. X and Y position, rotation θ, scales $M_X$ and $M_Y$ and trapezoid distortions $\Delta_X$ and $\Delta_Y$. These parameters are, however, restricted to a single plane, that is, the X and Y directions parallel to the wafer plane. By means of the four additional marks 17b another set of parameters can be measured which refer to a different plane parallel to the wafer plane, e.g. positions X' and Y' and scales $M'_X$ and $M'_Y$, where the prime denotes the fact that these quantities relate to a different Z plane. With an ion-beam system the two planes can be spaced apart by several millimieters, e.g., 5 mm. Keeping constant the corresponding quantities in the two Z planes also keeps the beam landing parameters constant to a first order and therefore results in a stable image at the target plane. In one embodiment, the detected magnifications M, M' are used to control the voltage of two different electrodes, the differences between M and $M_X$ or $M_Y$, and between M' and $M'_X$ or $M'_Y$ control quadrupole fields supplied by the multipoles of the pattern lock device 3, the trapezoid distortions are fed to a multipole provided within the illumination optics of the mask to change the direction of the beam at the mask, and the rotation θ controls the current through the solenoids of the pattern lock device 3.

The additional marks 17b are arranged at X,Y locations between those of the marks 17a. It is noteworthy that the arrangement of the marks 17b in the second z plane does not resemble the arrangement of the marks 17a in the first plane, or of a subset of these marks. Although it is, in principle, possible to arrange the marks in the different planes in corresponding arrangements, which could simplify the direct comparison of the alignment parameters thus detected, this is often not possible due to the inherently limited space. Rather, in the embodiment shown, the additional marks 17b are located in a square-like arrangement around the aperture 31 for the optical path of the pattern beam 36. The marks 17b are oriented perpendicular to the respective radii as shown in FIG. 5 in order to allow for measuring the X and Y scales of the beam image with the two pairs of opposing marks.

With this geometry, the marks 17b are not in parallel with the axes of the respective detectors. If the known detector technology of electron multiplier detectors (or channeltrons) is used with these marks 17b, the detected signals will be asymmetric. For, when a reference beam is scanned over the groove which represents an alignment mark, the amount of secondary electrons emitted into the electron multiplier will be different for the two flank sides. Processing of asymmetric signals, however, is difficult and complicates the determination of the alignment parameters. Furthermore, due to the restricted space, in particular when the number of alignment marks is increased, electron multiplier technology becomes problematic due to their delicate and space-consuming construction; miniaturization would lead to considerable costs. What is more, a channeltron or electron multiplier detector needs a high voltage supply, incurring considerable power consumption.

In a further aspect of the invention, the detectors of the alignment system are adapted to measure a continuous current of the secondary electrons which are produced from the impact of the reference beams scanned over the respective alignment marks, as shown in FIG. 5. This solution replaces the discrete measurement of particles as a sequence of events by a continuous measurement of electrical current.

As can be seen from FIG. 5, for each alignment mark 17a, 17b a detector electrode 47a, 47b is provided which serves as the secondary radiation current detector. The electrode 47a, 47b is positioned above and lateral to the corresponding alignment mark 17a, 17b. In order to enhance the yield of the electrons emitted as secondary radiation from the alignment mark, the electrode is held at a positive potential with respect to the ground potential of the surrounding components and the potential of the platelet on which the reference mark resides. The potential difference to the detector electrode thus serves to form an electric guidance field for the secondary electrons emitted from the alignment mark. Experiments showed that a detector electrode potential UD (FIG. 6) of several 10 V, e.g. 30 V or 40 V, is sufficient to obtain a high yield of more than 98% of the emitted electrons.

A further important feature of the electrode detector is the shaping and position of the electrode. It was found that the shape and position must depart sufficiently from symmetry with respect to the beam axis of the incoming reference beam. For, if the electrode is formed symmetric, for example as a ring electrode around the path of the reference beam, the trajectories of the emitted electrons will by symmetric as well, and a considerable fraction of these trajectories will lead back to the emitting electrode (i.e., the alignment mark platelet) instead of hitting the detector electrode. By choosing an asymmetric shape of the detector electrode as shown e.g. in FIG. 4, the fraction of the electrons travelling back to the platelet can be reduced to an amount of less than 2% (corresponding to the mentioned yield of more than 98%).

Figure 6:
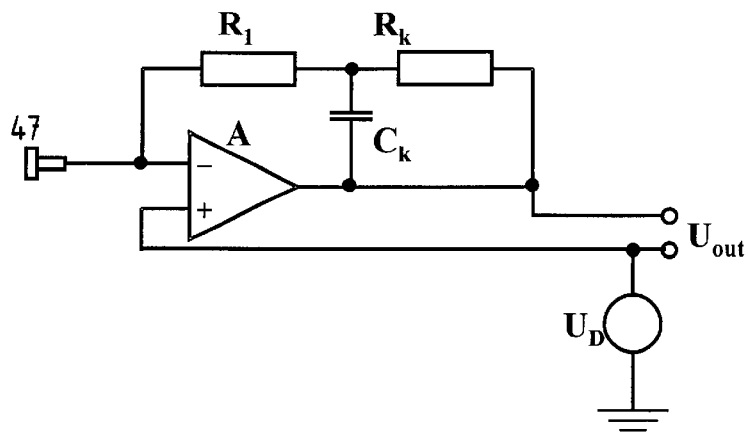
FIG. 6 an amplifier circuit for the electrode detector of FIG. 5.

Even with a proper choice of the electrode potential and shape, the electric current of secondary radiation detected by the electrode detector will be small, i.e. in the range of pA, and need to be amplified before further processing. An electrometer amplifier as shown in FIG. 6 can be used with the invention in order to convert the small input current into a voltage $U_{out}$ in the mV range.

Of course, the input line connected to the detector electrode 47 should be held short in order to avoid noise from stray fields. The amplifier circuit is based on a conventional electrometer circuit, consisting of an operational amplifier A, e.g. a Burr-Brown OPA 129, with a feedback resistor $R_1$ whose resistance is very high in order to achieve a very low noise, e.g. in the range of 100 GΩ. In order to compensate the input capacitance of the amplifier circuit and to enhande rapidity of the circuit, a compensator element is provided, which comprises an RC group $R_k C_k$. The compensator resistor $R_k$ is e.g. in the kΩ range and the compensator capacitor $C_k$ in the range of pF.

We claim:

1. An apparatus for use in a particle projection lithography system in an alignment system adapted to measure the position and shape of an optical image of a pattern of structures formed in a mask and imaged onto a target by means of a broad particle beam, the apparatus having a plurality of alignment marks adapted to produce secondary radiation upon irradiation with radiation of said particle beam and provided with an aperture for the part of the beam that generates said optical image, the alignment marks being positioned outside said aperture for said image generating beam part, arranged at positions to coincide with particle reference beams projected through reference beam forming structures provided on the mask while said optical image is projected onto the target, and situated on at least two different levels over the target as seen along the directions of the respective reference beams.

2. The apparatus of claim 1, adapted to use in an ion projection lithography system wherein the particles are ions.

3. The apparatus of claim 1, wherein the alignment marks are situated on positioning means disposed outside the aperture for the image generating beam part and are positioned on sides of the positioning means directed towards the mask.

4. The apparatus of claim 3, wherein the alignment marks are formed on the surface of platelets, the platelets being fixed onto the positioning means by bonding.

5. The apparatus of claim 4, wherein the platelets are silicon platelets in which the alignment marks are formed as structures of different height with respect to the surrounding surface of the silicon platelet.

6. The apparatus of claim 1, comprising a reference plate adapted to be positioned in a predetermined position relative to the target, being provided with an aperture corresponding in size to the part of the beam that generates said optical image, and with alignment marks disposed outside said aperture.

7. The apparatus of claim 6, wherein the reference plate is a zerodur plate.

8. The apparatus of claim 1, further provided with detector means for each alignment mark provided with an electrode adapted to measure a secondary electron current emitted from the alignment marks.

9. The apparatus of claim 8, wherein the electrode is formed asymmetric with respect to the corresponding alignment mark and held at a positive electrical potential with respect to the potential of the alignment mark and surrounding components.

10. The apparatus of claim 1, wherein eight alignment marks are positioned on a first level and four alignment marks are positioned on a second level.

11. The apparatus of claim 1, wherein the distance between two different levels is in the order of the distance of the alignment marks from the plane defined by the target surface.

* * * * *